United States Patent
Dötsch et al.

(10) Patent No.: US 6,958,244 B2
(45) Date of Patent: Oct. 25, 2005

(54) LOW-CONDUCTIVITY BUFFERS FOR MAGNETIC RESONANCE MEASUREMENTS

(75) Inventors: Volker Dötsch, San Francisco, CA (US); Richard S. Withers, Sunnyvale, CA (US)

(73) Assignee: Bruker BioSpin Corp., Billerica, MA (US)

( * ) Notice: Subject to any disclaimer, the term of this patent is extended or adjusted under 35 U.S.C. 154(b) by 199 days.

(21) Appl. No.: 10/122,153

(22) Filed: Apr. 12, 2002

(65) Prior Publication Data

US 2003/0194810 A1 Oct. 16, 2003

(51) Int. Cl.[7] .............................................. G01N 24/00
(52) U.S. Cl. ........................ 436/173; 436/8; 436/163
(58) Field of Search ............................ 436/8, 163, 173

(56) References Cited

U.S. PATENT DOCUMENTS 5,275,708 A    1/1994   Akins, Jr. et al.

OTHER PUBLICATIONS

Moy et al. "High–Resolution Solution Structure of the Inhibitor–Free Catalytic Fragment of Human Fibroblast Collagenase Determined by Multidimensional NMR", Biochemistry, 1998, v. 37, pp. 1495–1504.*

Caaveiro et al. "Differential Interaction of Equinatoxin II with Model Membranes in Response to Lipid Composition", Biophys. J v. 80, Mar. 2001, pp. 1343–1353.*

Kelly et al. "Low–Conductivity Buffers for High–Sensitivity NMR Measurements", J. Am. Chem. Soc., 2002, v. 124, pp. 12013–12019.*

"Choice of lysis buffer and additives", http://www.embl-heidelberg.de/ExternalInfo/geerlof/draft_frames/flowchart/extraction_clarification/buffer.html, Nov. 9, 2000.*

Drew et al. "Actin isoform expression, cellular heterogeneity, and contractile function in smooth muscles", Can. J. Physiol. Pharmac., 1997, v. 75, pp. 869–877.*

Ukaji et al. "Accumulation of Small Heat–Shock Protein . . . ", Plant Physiology, Jun. 1999, v. 120, pp. 481–489.*

Sudmeier, J.L. et al., "Dependence of NMR Lineshape Analysis upon Chemical Rates and Mechanisms: Implications for Enzyme Histidine Titrations", Journal of Magnetic Resonance, vol. 40, Academic Press, Inc., 1980, pp. 377–390.

Flynn, Peter F. et al., "Optimal Use of Cryogenic Probe Technology in NMR Studies of Proteins", American Chemical Society, vol. 122, Published on Web, 2000, pp. 4823–4824.

* cited by examiner

*Primary Examiner*—Yelena G. Gakh
(74) *Attorney, Agent, or Firm*—Kudirka & Jobse, LLP

(57) ABSTRACT

An NMR buffer is particularly useful for biomolecules that require a certain amount of salt in the buffer solution. A primary buffer component and a titrating component are selected based on low ion mobility. These selections allow for a lower conductivity buffer without reducing the salt content. As such, a higher sensitivity experiment results.

14 Claims, 3 Drawing Sheets

LOW-CONDUCTIVITY BUFFERS FOR MAGNETIC RESONANCE MEASUREMENTS

FIELD OF THE INVENTION

This application relates to the field of magnetic resonance and, more specifically, to buffer solutions for nuclear magnetic resonance (NMR) spectroscopy.

BACKGROUND OF THE INVENTION

In recent years, NMR spectroscopy has become one of the most important analytical tools in organic chemistry, as well as in structural biology and biochemistry. However, compared to other spectroscopic techniques, NMR spectroscopy is a relatively insensitive method, requiring samples concentrations in the micromolar and even millimolar range. Nevertheless, NMR provides an enormous amount of details about the chemical organization and the structure of compounds. The introduction of new equipment and techniques has helped to improve the sensitivity in NMR experiments. One important improvement has come in the form of cryogenic probes, which generate and receive the NMR pulses being used during examination of a sample. The sensitivity increase is achieved by cooling the radio frequency (RF) receiver coils to temperatures of 15 to 30° K. The colder coils have lower resistance and, therefore, higher quality factors (Q). This, in turn, increases the signal amplitude and lowers the thermal noise. Both the higher Q-factor and the lower noise result in an increase in the overall signal-to-noise (S/N) ratio and therefore in the sensitivity of the apparatus.

The sensitivity of cryogenic probes, however, is also dependent on the use of samples and sample solutions having the appropriate electrical characteristics. An electrically conductive sample, such as one using a conventional buffer typical of protein structure determinations, will add a resistance to the coil, which can significantly reduce the signal-to-noise ratio. However, many biological macromolecules must be studied in buffered solutions to keep the pH constant and the molecule in a defined protonation state. Moreover, in many cases, salts are added to a buffer to increase solubility and to prevent aggregation of the investigated biomolecules. But salt concentrations of 100 to 150 mM, which are typical for many biological samples, significantly decrease the sensitivity advantage of a cryogenic probe.

SUMMARY OF THE INVENTION

In accordance with the present invention, a buffer is provided that significantly increases the sensitivity of an NMR spectroscopy examination of a biomolecule. In order to provide the enhanced sensitivity, the conductivity of the buffer is made particularly low, while maintaining a salt level sufficient to support the biomolecule under test. The buffer may also be deuterated for certain NMR applications. The buffer is a buffer solution with a known pKa, and includes a primary buffer component and a titrating agent. However, the primary buffer component and the titrating agent have ion mobilities that are sufficiently low that the conductivity of the buffer is minimized.

Although dependent on the particular circumstances of the examination in question, the primary buffer components and titrating agents are such that, if the primary buffer component was at a concentration of 200 mM, the conductivity of many buffers according to the invention would be no greater than 5.0 milliSiemens/centimeter (mS/cm). Since the conductivity is concentration dependent, the actual conductivity would depend on the concentration, but would satisfy a corresponding limit adjusted for concentration.

In certain circumstances, the ion mobility of the primary buffer component and the titrating agent may be kept low if a weak acid (or base) titrating agent is used with a weak base (or acid) primary buffer component. Some examples of buffers according to the invention include, for a pH of approximately 7.0, a primary buffer component of MOPS and a titrating agent of Bis-Tris Propane. As an alternative at the 7.0 pH level, a primary buffer component of Hepes may be used with a titrating agent of either Bis-Tris Propane or sodium hydroxide. For a pH of approximately 8.0, a primary buffer component of Bicine may be used with a titrating agent of either sodium hydroxide or Tris base. Other low conductivity buffers are also possible.

A method of selecting an appropriate buffer for a molecular substance to be examined in an NMR spectrometer may take into account certain steps. First, the pH of the isoelectric point of the molecular substance should be determined. A pH should be selected relative to the pH of the isoelectric point so as to allow adequate solubility of the molecular substance. Available primary buffer components may then be determined based on their having pKa values corresponding substantially to the selected pH value. From these components, a selection should then be made based on the ion mobility of the primary buffer component and the ion mobility of any appropriate titrating agent, such that the resulting buffer has a minimum conductivity.

BRIEF DESCRIPTION OF THE DRAWINGS

The above and further advantages of the invention may be better understood by referring to the following description in conjunction with the accompanying drawings in which.

DETAILED DESCRIPTION

Figure 1:
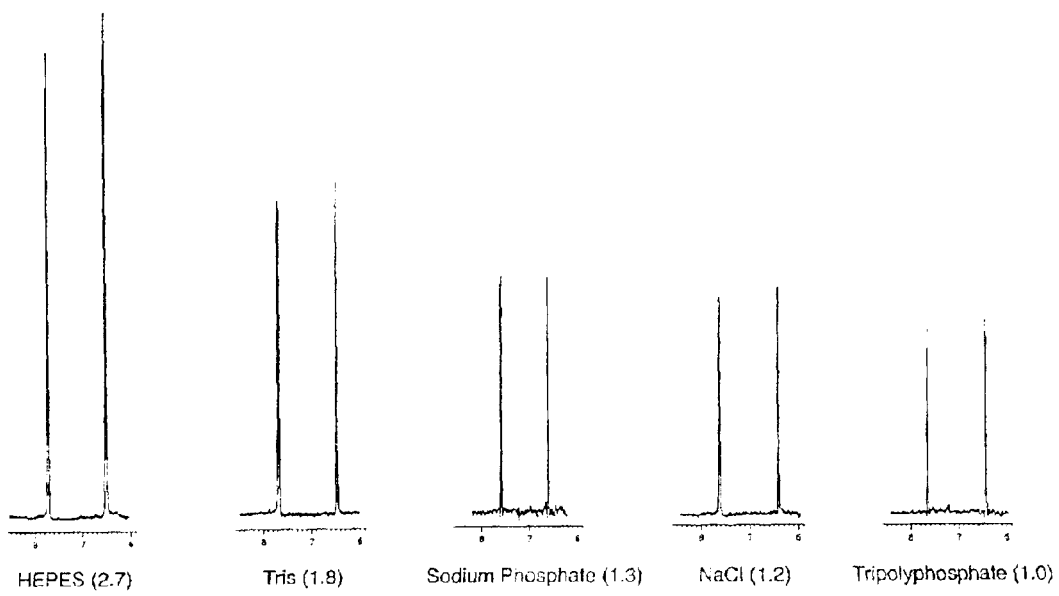
FIG. 1 depicts one-dimensional spectra of several different buffer materials showing the different sensitivities provided by each in NMR experiments.

In a typical high-resolution NMR spectroscopy analysis, a liquid sample is located in a glass tube and placed inside a tuned radio-frequency (RF) coil inside a magnet that produces a strong static magnetic field. One common examination is for the signals generated by the $^1$H nuclei (protons), which have a resonant frequency of 500 MHz in an 11.7 Tesla magnet. To perform such an examination, the RF coil is tuned to the 500 MHz frequency. The coil is used to generate a strong RF magnetic field in the sample along a direction perpendicular to the direction of the static magnetic field, and to detect subsequent NMR signals from the sample.

As is known in the art, a short but strong RF pulse is generated with the coil. This excites the nuclei, and the transient decay of their magnetization is received by the RF coil and coupled to a low-noise amplifier. This "free-induction decay" signal is processed by a receiver and used to generate an NMR spectrum of the sample.

The signal-to-noise ratio (S/N) of NMR experiments depends on many different factors, including the conditions of hardware components of the system, such as the coil and the preamplifier. The following ratio may be used to approximate the contributions of these different conditions to the overall S/N ratio.

$$S/N \sim (T_c R_c + T_a[R_c + R_s] + T_s R_s)^{-0.5} \quad (1)$$

where $T_c$ is the temperature of the coil, $R_c$ is the resistance of the coil, $T_s$ is the temperature of the sample, $R_s$ is the resistance added to the coil by the sample, and $T_a$ is the noise temperature of the preamplifier.

In cyrogenic probes, the temperature of the coil is in the range of 15–30° K, the preamplifier noise temperature is in the range of 10–15° K, and the coil resistance is small compared to the resistance of conventional room temperature probes. Thus, the first two terms of the above equation are relatively small, and the sensitivity of the probe is correspondingly high, as compared to conventional probes. However, the third term is similar for conventional and cryogenic probes, since it depends primarily on the sample temperature and sample resistance. As this third term increases, the sensitivity decreases. Moreover, since the first two terms are so much smaller in a cryogenic probe, the third term has that much more influence over the total S/N ratio.

For most biological, and many chemical, applications, the sample temperature must be kept within a range of about 30° K, which amounts to about 10% of the value of $T_s$. The other portion of the third term, $R_s$ depends on the chemical makeup of the sample. Since much of the sample is comprised of a buffer solution within which a selected material is located, the particular resistive characteristics of the buffer solution contribute significantly to $R_s$.

One of the primary components in many buffer solutions used with organic samples, such as proteins, is some form of salt. With conventional buffers, higher salt concentration results in higher conductivity. While it would therefore be advantageous to reduce the salt content, the sample material located within the buffer typically requires a particular salt concentration to maintain its natural characteristics. Thus, simply reducing the salt concentration may not be an option for improving the S/N ratio of the system.

In order to improve the S/N ratio without inappropriate reductions in salt concentration, the present invention addresses other characteristics of the sample buffer that contribute to its level of conductivity. Notably, the conductivity of the sample buffer depends not only on the ionic concentration of the solution, but also on the mobility of the ions in the solution and their respective charge. For a solution containing different ions, their individual contributions to the conductivity a may be summed up as follows:

$$\sigma = \Sigma c_i q_i \mu_i \quad (2)$$

where c is ionic concentration, q is charge and $\mu$ is ionic mobility, and the index i covers all of the ionic species present in the solution. In the present invention, buffers with low ion mobility $\mu$ are selected so as to reduce the conductivity of the sample buffer, without requiring a reduction in salt concentration.

One measurement that may be used to examine the sensitivity of a cryogenic probe using a particular buffer solution is the quality (or "Q") factor of the proton channel. In accordance with the present invention, tests were done using a 500 MHz Avance Bruker NMR instrument with a triple resonance cryogenic probe. Measurements of individual quality factors and of $Q_0$, the quality factor of the empty, unloaded probe, allows the calculation of the ratio of sample resistance $R_s$ to coil resistance $R_c$ as follows:

$$R_s/R_c = Q_0/Q - 1 \quad (3)$$

This ratio can, in turn, be used to calculate the sensitivity loss factor L, which is defined as the ratio of the sensitivity of the loaded probe and the unloaded probe:

$$L = \frac{(S/N)_{loaded}}{(S/N)_{unloaded}} = \sqrt{\frac{R_c(T_c + T_a)}{R_c T_c + T_s R_s + T_a(R_c + R_s)}} = \left(1 + \frac{R_s(T_s + T_a)}{R_c(T_c + T_a)}\right)^{-0.5} \quad (4)$$

Thus, it is apparent that the factor L can fall anywhere between 0 and 1, with 1 being the highest achievable sensitivity, i.e., that of a probe with a completely nonconductive sample.

For a good example comparison, the temperatures for use with the foregoing equation for L are set to $T_s = 298°$ K, $T_c = 27°$ K. and $T_a = 15°$ K. Using these values, this equation may be simplified to:

$$L = (1 + 7.45(R_s/R_c))^{-0.5} \quad (5)$$

Using this equation, the correlation between buffer conductivity and sensitivity may be shown. In Table 1 below, the sensitivity loss factor is shown for a number of conventional buffer solutions, using a concentration of 200 mM.

TABLE 1

| Buffer | $R_s/R_c$ | Sensitivity Loss Factor | Conductivity (mS/cm) |
|---|---|---|---|
| Tripolyphosphate | 2.71 ± .04 | 0.22 | 31.3 |
| Potassium Chloride | 1.93 ± .04 | 0.26 | 23.3 |
| Sodium Pyrophosphate | 1.70 ± .04 | 0.27 | 20.2 |
| Sodium Chloride | 1.64 ± .04 | 0.28 | 18.1 |
| PIPES | 1.33 ± .04 | 0.30 | 14.8 |
| β-glycerophosphate | 1.31 ± .04 | 0.30 | 14.9 |
| Potassium Phosphate | 1.25 ± .04 | 0.31 | 14.1 |
| TRIS | 1.24 ± .04 | 0.31 | 14.1 |
| Sodium Acetate | 1.11 ± .03 | 0.33 | 12.2 |
| Sodium Phosphate | 0.95 ± .03 | 0.35 | 11.0 |
| TAPS | 0.90 ± .03 | 0.36 | 9.55 |
| Tetrabutylammonium Phosphate | 0.69 ± .03 | 0.40 | 9.00 |
| HEPES | 0.22 ± .02 | 0.62 | 0.06 |
| CAPS | 0.14 ± .02 | 0.70 | 0.7 |
| TES | 0.12 ± .02 | 0.73 | 0.25 |
| MOPS | 0.10 ± .02 | 0.76 | 0.04 |
| CHES | 0.08 ± .02 | 0.79 | 0.06 |
| MES | 0.08 ± .02 | 0.80 | 0.15 |
| Bicine | 0.05 ± .02 | 0.86 | 0.031 |
| Bis-TRIS Propane | 0.05 ± .02 | 0.86 | 0.022 |
| Tris Base | 0.03 ± .02 | 0.91 | 0.1 |
| Bis-TRIS | 0.02 ± .02 | 0.93 | 0.0236 |
| Deionized Distilled H2O | 0.01 ± .02 | 0.98 | 0.0023 |

As shown, the resulting DC conductivity values for the materials shown in Table 1 vary widely, and there is a direct correspondence to the sensitivity loss factors.

The solutions shown in Table 1 were not adjusted to a particular pH. For some of the materials, at certain pH levels, many of the molecules of these materials will not be ionized, and the conductivity values therefore appear very low. However, those skilled in the art will recognize that Table 1 is intended only to demonstrate the variation in conductivities between different primary buffer components.

When considering the titration of the buffer, it is important to consider the ion mobility of the titrating agent. Since the conductivity of the entire sample is the sum of the contributions of the individual ion species, adding ions with a high mobility can have a detrimental effect on the sensitivity.

Table 2 below shows the ion mobilities, relative to potassium, of some different materials at a molar concentration of 200 mM. Each of these mobilities refers to anion mobility.

TABLE 2

| Buffer | Ionic mobility (relative to K$^+$) |
|---|---|
| Dihydrogen phosphate (H$_2$PO$_4^-$) | 0.45 |
| Hydrogen phosphate (HPO$_4^{2-}$) | 0.39 |
| TRIS | 0.4 |
| Acetate | 0.56 |
| HEPES | 0.3 |
| MOPS | 0.35 |
| MES | 0.37 |

As shown, certain materials in Table 2, such as HEPES, MOPS and MES, have ionic mobilities lower than those of other materials. Most biological and chemical NMR applications require a particular pH value, to keep the solute in a defined protonation state. Typically, specific pH values are achieved by titrating a solution of a weak acid or weak base with a strong base or strong acid, for example hydrochloric acid or sodium hydroxide. Alternatively, specific pH values are achieved by mixing the appropriate amounts of an acid and its conjugate base according to the Henderson Hasselbalch equation. Titrations of a buffer solution, however, add additional ions to the solution. Since the conductivity of the entire sample is the sum of the contributions of the individual ion species, adding ions with a high mobility can have a detrimental effect on the sensitivity. The problem can be avoided if an acid or base with low ion mobility is added. Unfortunately, most acids and bases with low ion mobilities are weak and the titration of a weak acid with a weak base does not necessarily produce a good buffer. However, if the pka values of both involved compounds are very similar, solutions with good buffer capacities can be produced using weak acids and bases. Examples are combinations of the base BisTrisPropane (pka 6.8) with the acids PIPES (pka 6.8) or MOPS (pka 7.2) and Tris base (pka 8.1) with bicine (pka 8.3).

In preparing a low conductivity buffer, one may use the values shown in Table 1 to select from the lower conductivity compounds and titrate them either with hydrochloric acid or sodium hydroxide or, if the material is a weak acid or a weak base, and the pKa is close to the pKa of a weak base or acid (as appropriate to titrate the selected material) it may be possible to use a titrating agent with particularly low ionic mobility. Table 3 summarizes some possible results.

TABLE 3

| Buffer | Titrated With | PH | R$_s$/R$_c$ | S/N Factor | Conductivity (mS/cm) |
|---|---|---|---|---|---|
| Bis Tris Propane | HCl | 6.8 | 1.76 ± .04 | 0.27 | 19.34 |
| | PIPES | 6.8 | 0.84 ± .03 | 0.37 | 8.75 |
| Tris Base | HCl | 8.0 | 0.88 ± .03 | 0.36 | 9.60 |
| | TES | 8.0 | 0.60 ± .03 | 0.43 | 5.71 |
| Sodium Phosphate | | 7.0 | 1.63 ± .04 | 0.28 | 17.34 |
| MOPS | Bis-Tris Propane | 7.0 | 0.22 ± .02 | 0.61 | 2.40 |
| Bicine | NaOH | 8.0 | 0.26 ± .02 | 0.58 | 2.61 |
| | Tris Base | 8.0 | 0.29 ± .02 | 0.56 | 2.50 |
| Hepes | Bis-Tris Propane | 7.0 | 0.31 ± .02 | 0.55 | 1.30 |
| | NaOH | 7.0 | 0.41 ± .02 | 0.50 | 2.44 |

Shown are both buffer components, the pH of the resulting buffer, the Rs/Rc ratio, the predicted sensitivity loss factor L, and the DC conductivity of the solution in milliSiemens per centimeter. Clearly, certain combinations show significantly higher predicted sensitivities than others. In particular, the combination of MOPS and BisTrisPropane at pH 7 as well as Bicine and Tris base at pH 8 should achieve high sensitivities. For example, the combination of MOPS and Bis-Tris Propane has a pH of 7.0 with a sensitivity of 0.61, while the combination of Bicine and Tris base has pH of 8.0 and a S/N factor of 0.56.

The buffer materials discussed above have described in terms of a 200 mM concentration. Those skilled in the art, however, will recognize that other concentration levels may be used in practice, and that the 200 mM concentration used herein is to allow relative comparative analysis of different materials. In particular, many biological NMR experiments are carried out at buffer concentrations of approximately 50 mM. However, the 200 mM concentration is useful for the present discussion, and may likewise be used to compare the ion mobilities of these different materials.

As mentioned above, the conductivity of a buffer solution also depends on the charge of its ions. At the same molarity, a buffer with multiple charges, such as phosphate, reduces the sensivity more than a buffer with a single charge and similar ion mobility. To predict the effect of a certain buffer on the sensitivity, the protonation state of its ions also has to be considered. While at pH values of about 2.0, the main species of a phosphate buffer are H$_3$PO$_4$ and H$_2$PO$_4^-$. At the more biologically relevant pH of 7.0, H$_2$PO$_4^-$ and H$_2$PO$_4^{2-}$ are dominant and a further decrease of the sensitivity due to the increased charge is expected. The foregoing comparative data is based on a molarity of 200 mM. The use of a molarity-based comparison rather than a normality-based one (where the different materials are normalized to the same amount of charge) allows buffers with similar buffering capacities to be compared.

In accordance with the present invention, it is possible to prepare buffers that have conductivities well below those of the prior art. Looking at Table 3, it may be seen that the buffers hereunder include a number with conductivities well below 5.0. Thus, the buffers according to the present invention provide a much greater degree of sensitivity than was previously available, and are particularly valuable for NMR experiments using cryogenic probes. It should also be noted that, since the buffers are used in NMR experiments, it is typically necessary that they be deuterated. In particular, it is advantageous if both the base buffer material and any titrating agent is deuterated.

Further investigation of the differences in buffer sensitivities was done using NMR experiments. A 2 mM solution of para-aminobenzoic-acid (PABA) was used in each of a 200 mM solution of HEPES/NaOH (pH 7.0), Tris Base/HCl (pH 8.0), NaCl, sodium phosphate (pH 7.0) and Triployphosphate (unadjusted pH). FIG. 1 shows one-dimensional spectra acquired using these samples. These spectra confirm that the type of buffer has a dramatic effect on the sensitivity of NMR experiments. Furthermore, comparison of the relative intensities in the spectra with the predicted sensitivity loss factors L of the used buffers demonstrates a good correlation.

The foregoing experiments were all performed at a concentration of 200 mM. However, in practice, different NMR experiments require different ion concentrations. The relative sensitivity gain of a particular buffer relative to another also depends on the concentration. For example, from Table 3, it can be seen that some of the best buffers shown have a conductivity of no greater than 5.0 mS/cm at a concentration of 200 mM. However, the conductivity values can be different for different concentration levels. Nevertheless, a similar relative performance exists at other concentrations, and the resulting conductive values can be determined for other concentrations.

The dependence of the relative sensitivity of two buffers can be calculated from the ratio of their sensitivity loss factors $L_1$ and $L_2$:

$$\frac{L_1}{L_2} = \sqrt{\frac{\left(1 + 7.45 \frac{R_{s2}}{R_c}\right)}{\left(1 + 7.45 \frac{R_{s1}}{R_c}\right)}}$$

For low buffer concentrations, the sample resistance of the two buffers $R_{s2}$ and $R_{s1}$ decreases. In the limit of very low concentrations, the factor $7.45 R_{s2}/R_c$ becomes small relative to 1 and can, therefore, be neglected. In such a case, the ratio of $L_1/L_2$ is equal to 1.0, and the sensitivity is independent of the nature of the buffer. At high salt concentrations, the sample resistance becomes the dominant factor in the above equation. In such a case, the factor $7.45 R_s/R_c$ becomes large relative to 1.0 and, in combination with the foregoing equation for conductivity, σ, can be expressed as follows (ignoring the effect of the counterion in the sum):

$$\frac{L_1}{L_2} = \sqrt{\frac{\mu_2}{\mu_1}}$$

From this, it is apparent that, for high salt concentrations, the gain in sensitivity of a particular buffer over another buffer becomes independent of the actual ion concentration, and reaches a maximum that is equal to the square root of the ratio of the individual ion mobilities. For many of the salts in Table 3, this condition is fulfilled.

Figure 2:
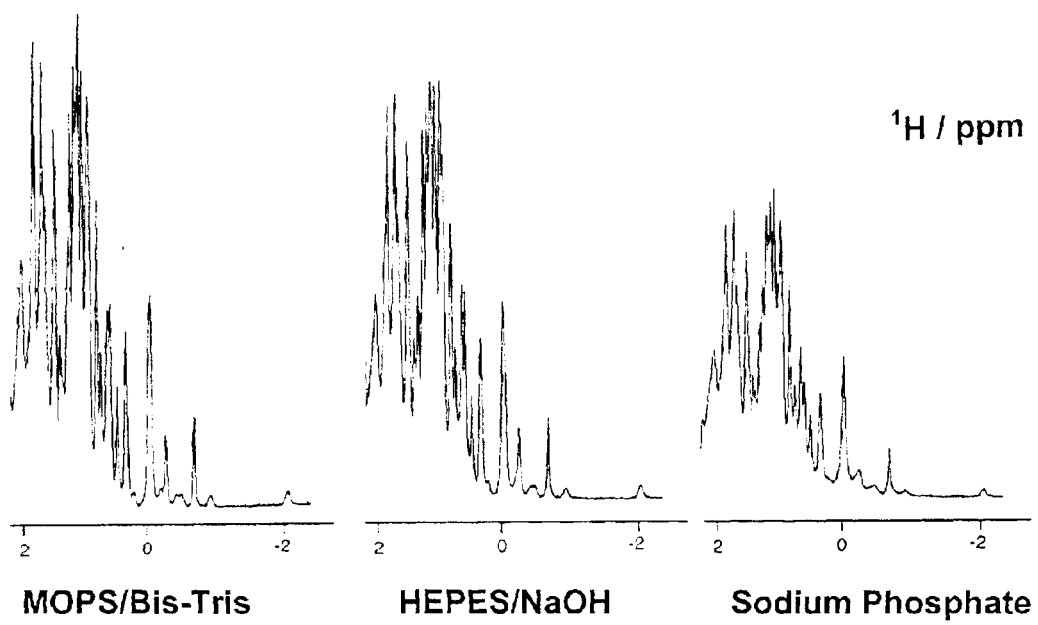
FIG. 2 depicts the different spectra of buffers according to the present invention.

Most biological NMR experiments are carried out at buffer concentrations of approximately 50 mM. The sensitivity gain of two of the buffers having good sensitivity values at a pH of 7.0 was investigated relative to the most commonly used NMR buffer, sodium phosphate. Solutions of 2 mM lysozyme were prepared in each of a sodium phosphate buffer, a MOPS/Bis-Tris propane buffer and a HEPES/NaOH buffer. The resulting three NMR spectra are shown in FIG. 2.

To avoid problems with differences in the amide proton exchange rates and overlap with buffer resonances, only the extreme high-field ends of the spectra were used for an analysis of the relative sensitivities. The MOPS/Bis-Tris propane buffered sample showed the highest sensitivity, about 1.1 times higher than the sensitivity in the HEPES/NaOH buffered sample, and about 1.5 time higher than the sensitivity of the phosphate-buffered sample. This fifty percent higher sensitivity relative to the most common NMR buffer demonstrates that careful buffer selection can lead to significant sensitivity gains, even under conditions typical for NMR experiments with biological samples.

Figure 3:
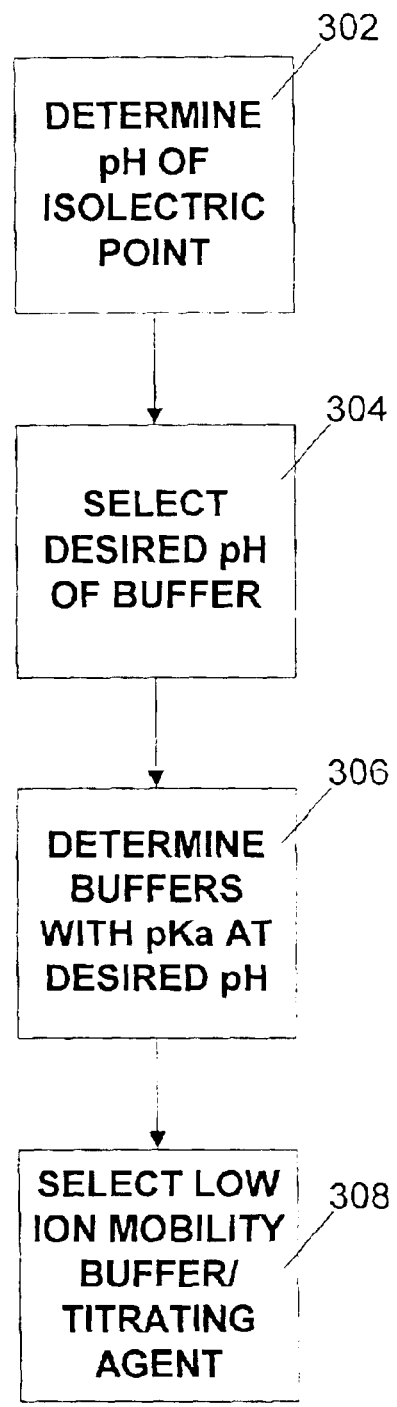
FIG. 3 is a flow diagram of a buffer selection process according to the present invention.

Selection of an appropriate buffer for a given NMR experiment may take into account a number of different criteria. However, the following series of steps represents one useful procedure for making such a selection given an experiment for examining a large biomolecule. The steps are shown as a flow diagram in FIG. 3.

First, the pH value at which the isoelectric point of the biomolecule is found (step 302). As this is the point of lowest solubility, the pH of the buffer must differ. The desired pH value of the buffer may then be selected (step 304). For biomolecules, the primary concern in this selection process is choosing a pH value best suited for the molecule itself. This value is the pH of the in vivo environment of the molecule, which is typically about 7.0. A secondary concern while choosing this pH level is the desire to minimize amide proton exchange. As is known in the art, lower pH values (as low a 3.5) are more desirable in this regard. However, reproducing the cellular environment of the biomolecule should be the primary concern.

Once a pH value is selected, the various buffers having a pKa at (or approximately at) the selected pH may be considered (step 306). The buffers being considered should include whatever titration is desired. Of these buffers, one with a particularly low ionic mobility is then selected (308). Because the buffers include the titrating agents, the ionic mobility of both the salt and the titrating material will have an effect on the overall ionic mobility, and the titrating agent must therefore also be selected according to these criteria.

While the invention has been shown and described with reference to preferred embodiments thereof, those skilled in the art will recognize that various changes in form and detail may be made herein without departing from the spirit and scope of the invention as defined by the appended claims. In particular, the specific buffer solutions described herein define a type of buffer that may use other specific materials. Notably, it is the characteristics of the buffers disclosed herein, not just the specific substances used, that provide a clear and distinct improvement over the prior art. The present invention is intended to cover all other buffers having those characteristics, regardless of whether the specific materials used have been discussed herein.

What is claimed is:

1. A method of performing an NMR sample analysis, the method comprising:
   providing a deuterated primary buffer component having an ion mobility sufficiently low that, at a concentration of 200 mM, it has a conductivity no greater than 5.0 mS/cm;
   titrating the primary buffer component with a titrating agent that changes the pH of the primary buffer component to be approximately equal to its pKa, the titrating agent having an ion mobility sufficiently low that, after titration, the conductivity of the titrated buffer is no greater than 5.0 mS/cm;
   placing a sample comprising a molecular substance of interest in the titrated buffer; and
   conducting an NMR analysis of the sample in the titrated buffer with an NMR spectrometer.

2. A method according to claim 1 wherein the primary buffer component is such that it has an ionic mobility relative to potassium of no greater than 0.4.

3. A method according to claim 1 wherein the molecular substance is a biomolecule.

4. A method according to claim 1 wherein the NMR spectrometer uses a cryogenic NMR probe.

5. A method according to claim 1 wherein the primary buffer component is a weak acid or weak base.

6. A method according to claim 5 wherein a titrating agent of the buffer is a weak acid or weak base.

7. A method according to claim 1 wherein said pH is approximately 7.0 and the primary buffer component comprises Morpholinepropanesulfonic acid (MOPS).

8. A method according to claim 7 wherein said titrating agent comprises 1,3-Bis(tris(hydroxymethyl)methylamino) propane (Bis-Tris Propane).

9. A method according to claim 1 wherein said pH is approximately 8.0 and the primary buffer component comprises N,N-Bis(2-hydroxyethyl)glycine (Bicine).

10. A method according to claim 9 wherein said titrating agent comprises sodium hydroxide.

11. A method according to claim 9 wherein said titrating agent comprises Tris (hydroxymethyl)-aminomethane (Tris Base).

12. A method according to claim 1 wherein said pH is approximately 7.0 and the primary buffer component comprises 2-(4-(2-Hydroxyethyl)-1-piperazinyl)ethanesulfonic Acid (Hepes).

13. A method according to claim 12 wherein said titrating agent comprises 1,3-Bis(tris(hydroxymethyl)methylamino) propane (Bis-Tris Propane).

14. A method according to claim 12 wherein said titrating agent comprises sodium hydroxide.

* * * * *

UNITED STATES PATENT AND TRADEMARK OFFICE
CERTIFICATE OF CORRECTION

PATENT NO. : 6,958,244 B2
APPLICATION NO. : 10/122153
DATED : October 25, 2005
INVENTOR(S) : Dötsch et al.

It is certified that error appears in the above-identified patent and that said Letters Patent is hereby corrected as shown below:

On the title page: item [73] should read

Assignee:  Bruker BioSpin Corp., Billerica, MA (US) and
The Regents of the University of California, Oakland, CA (US).

Signed and Sealed this

Twenty-ninth Day of July, 2008

JON W. DUDAS
*Director of the United States Patent and Trademark Office*